United States Patent [19]

Chang et al.

[11] Patent Number: 4,886,001

[45] Date of Patent: Dec. 12, 1989

[54] METHOD AND APPARATUS FOR PLASMA PYROLYSIS OF LIQUID WASTE

[75] Inventors: Robert C. W. Chang, Wilkins Twp., Allegheny County; Steven C. Vorndran, Hempfield Twp., Westmoreland County, Pa.; Michael F. Joseph, Monroeville; Michael R. Rowe, Latrobe; David A. Lewandowski, Rostraver Twp., Fayette County, all of Pa.

[73] Assignee: Westinghouse Electric Corp., Pittsburgh, Pa.

[21] Appl. No.: 339,879

[22] Filed: Apr. 14, 1989

Related U.S. Application Data

[63] Continuation of Ser. No. 229,884, Aug. 8, 1988, abandoned.

[51] Int. Cl.⁴ .............................................. F23G 5/00
[52] U.S. Cl. ..................................... 110/346; 110/250
[58] Field of Search ................................ 110/346, 250; 422/186.23, 186.25

[56] References Cited

U.S. PATENT DOCUMENTS 3,765,870 10/1973 fey et al. .
3,791,949 2/1974 Hirayama et al. .
4,438,706 3/1984 Boday et al. .
4,479,443 10/1984 Faldt et al. ........................... 110/346
4,582,004 4/1986 Fey et al. .
4,644,877 2/1987 Barton et al. .
4,770,109 9/1988 Schlienger ....................... 110/250 X
4,787,320 11/1988 Raaness et al. ...................... 110/250

Primary Examiner—Edward G. Favors
Attorney, Agent, or Firm—G. H. Telfer

[57] ABSTRACT

A method and apparatus for pyrolytically decomposing waste material characterized by injecting a mixture of waste and water into a plasma torch having an operation temperature of in excess of 5000° C. to form a mixture of product gases and solid particulate; separating the gases and particulate in a first cyclone separator into separate phases; transferring the particulate to a second cyclone separator and subjecting the particulate to a partial vacuum to separate any carryover gases from the particulate; subjecting the combined reaction chamber and carry over gases in a scrubber to a spray consisting of a caustic solution and water to eliminate any carryover particulate from the gases and to neutralize and HCl in the gases; and removing the gases from the scrubber.

18 Claims, 2 Drawing Sheets

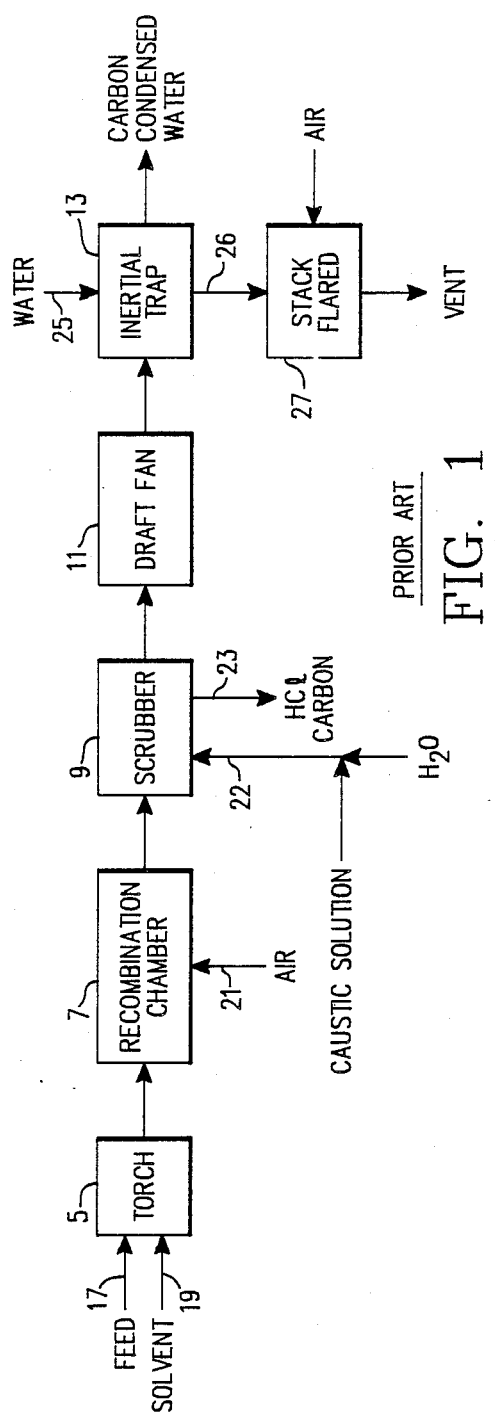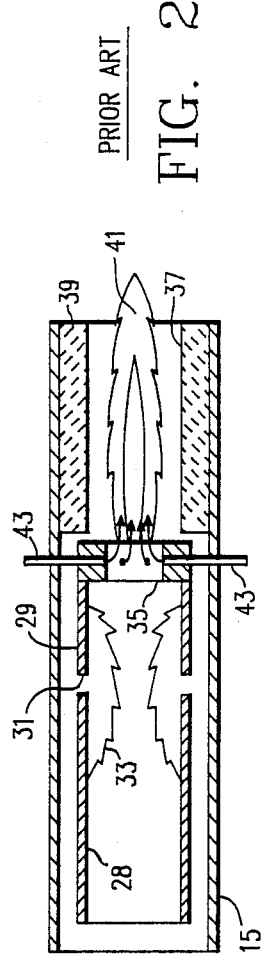

METHOD AND APPARATUS FOR PLASMA PYROLYSIS OF LIQUID WASTE

CROSS-REFERENCE TO RELATED APPLICATION

This application is a continuation of Application Ser. No. 229,884 filed Aug. 8, 1988, now abandoned.

BACKGROUND OF THE INVENTION

1. Field of the Invention

This invention relates to the destruction of waste material and, more particularly, it pertains to apparatus for disposing of toxic and hazardous materials by pyroplasmic decomposition.

2. Description of the Prior Art

The disposal of waste material is a growing problem due primarily to the fact that the volume of waste material is growing faster than existing disposal equipment and methods can handle it economically. Most attempts to dispose of waste materials by combustion have included furnaces or rotary kilns. More recently, apparatus and methods for waste destruction have included plasma pyrolysis, such as disclosed in U.S. Pat. No. 4,644,877, by which waste materials are fed into a plasma arc burner where they are atomized, ionized, and subsequently discharged into a reaction chamber to be cooled and recombined into product gases and particulate matter. The method of this patent involves the use of a solvent that is miscible with the waste materials, such as methyl ethyl ketone with PCBS.

While the disposal of waste materials with systems of the type described have been satisfactory, it is desirable to increase the feed throughput and reduce the formation of carbon particulate without the use of expensive solvents such as methyl ethyl ketone (MEK).

SUMMARY OF THE INVENTION

This invention involves a method for the pyrolytic destruction of waste material including the steps of mixing the waste material, water, and/or methanol into a plasma arc having a temperature in excess of 5000° C. to form a mixture of product gases and solid particulate, separating the gases and the particulate mixture in a recombination chamber into separate phases of gases and solid particulate; transferring the solid particulate to a separate compartment and subjecting the particulate to a partial vacuum to separate any carry-over gases from the particulate which carry-over gases are combined with the gases from the recombination chamber; transferring the gas from the recombination chamber to a scrubber and subjecting the gas to a water spray to eliminate any carry-over solid particulate from the gases; and removing the scrubbed gases from the product gas stream.

The invention also comprises apparatus for pyrolytically decomposing waste material which comprises a plasma torch productive of an electric arc having an operating temperature of at least 5000° C. for incinerating a solution of waste material to form a mixture of gases and solid particulate; a recombination chamber for receiving and separating the mixture of gases and solid particulate; a solid separator for providing a partial vacuum for removing any carry-over gases from the solid particulate; a transfer chamber for receiving gases from the recombination chamber; a scrubber for cleaning the gas from the transfer chamber by passing the gas through a water spray; and storage means for gases from the scrubber. In the alternative the transfer chamber is a combustion chamber for the gases and the burned gases are directed to a draft means, such as a stack, for delivery of the burned gases into the atmosphere.

The major advantage of this method and apparatus is that there is at least a threshold increase in the feed throughput with a reduction of the flue gas volume compared with prior art procedures. This process removes the free carbon directly from the recombination chamber and flares the product gases in the combustion chamber. Alternatively, as in the first design the high heating values of the product gases can bypass the combustion process for other use by closing the combustion air stream.

BRIEF DESCRIPTION OF THE DRAWINGS

FIG. 1 is a flow diagram of a pyroplasma unit of prior art structure.

FIG. 2 is a sectional view through a pyroplasma unit of prior art construction.

DESCRIPTION OF THE PREFERRED EMBODIMENT

Figure 3:
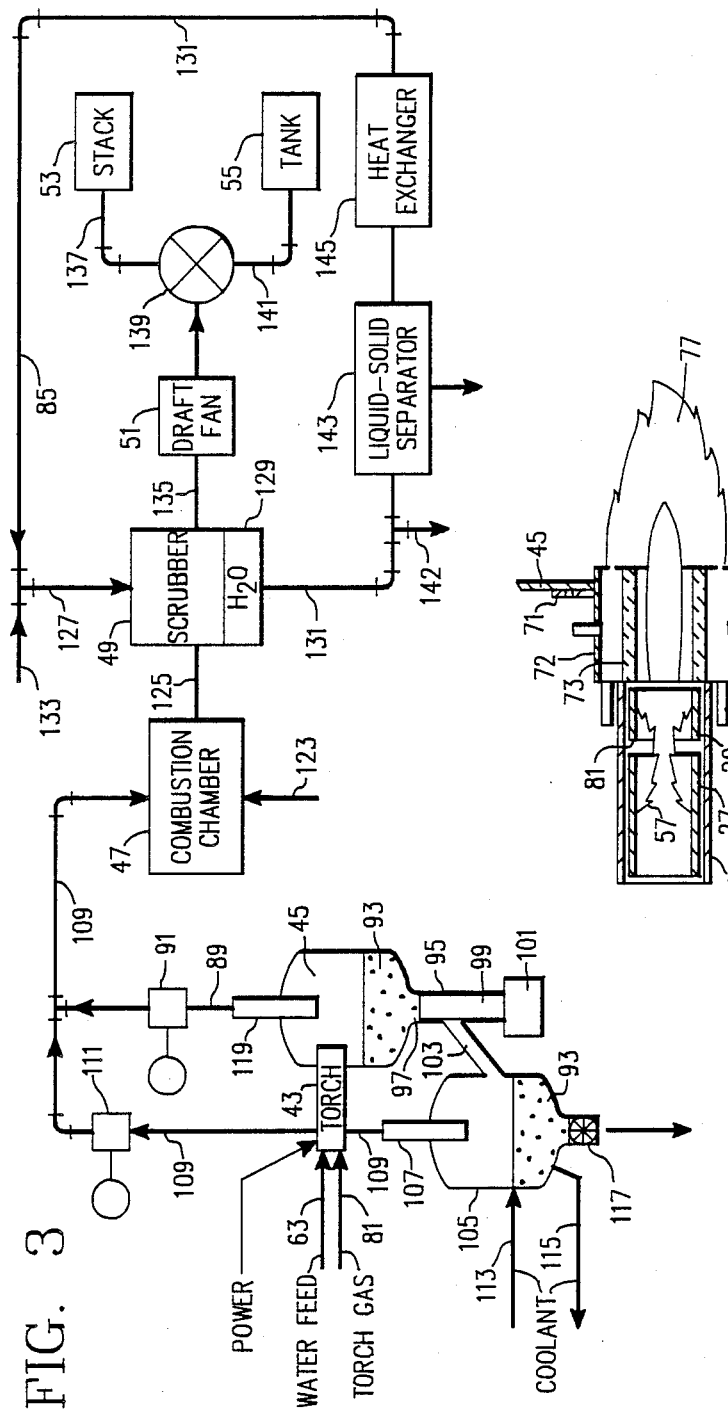
FIG. 3 is a flow diagram of the pyroplasma system of this invention.

A system for pyrolytically decomposing waste material of an existing, or prior art, method is shown diagrammatically in FIG. 1. It comprises a plasma torch 5, a recombination chamber 7, a scrubber 9, a draft fan 11, an inertial trap 13, and a stack 15.

The application of plasma technology to high temperature processes in the organic and inorganic material areas is recognized. The plasma torch by which the process of this invention is preferably performed includes a so-called arc heater which is similar in construction and operation to that disclosed in U.S. Pat. Nos. 3,765,870; 3,791,949; and 4,644,877 in which an electric arc extends between spaced electrodes with the generation of heat for the destruction of hazardous and toxic wastes.

Waste material is fed into the torch 15 at inlet 17 together with a solvent at an inlet 19. A typical waste material is hazardous and toxic and contains a mixture of about 60% polychlorinated biphenyls (PCB) and of about 40% trichlorobenzene (TCB) which is derived from the operation of electric transformers and is commonly referred to as Askarel. Liquid waste material is introduced into the torch feed inlet 17 which together with a solvent comprising a mixture of methyl ethyl ketone (MEK) (50% by weight) and methanol (50%) is introduced (FIG. 1) to supply the hydrogen source to produce hydrogen chloride (HCl). The solvent is miscible with Askarel. The mixture of the feed and solvent is processed at the high temperatures of operation of the plasma arc, typically ranging from 5000° C. to 15,000° C., forming a mixture of product gases and solid particulate, which is directed into the recombination chamber 7, where in the presence of air introduced at inlet 21, produces a gaseous mixture consisting of $H_2O$, $H_2$, CO, $CO_2$, $N_2$, and HCl. The gaseous mixture is then directed into the scrubber 9 where a caustic solution of water ($NaOH + H_2O$) sprays at 22 the gaseous mixture to eliminate solid particulates and to convert the HCl to NaCl mixed with water. The resulting blow-down water containing NaCl and carbon particulate is drained from the scrubber at outlet 23.

The draft fan 11 transfers the gas from the scrubber 9 to the inertial trap 13 where it is subjected to additional water spray 25 to further eliminate carbon particulate. Blow-down water is drained at 26. From the inertial trap 13 the gas products are flared and vented into the atmosphere through the stack 27. The foregoing comprises the prior art procedure as shown in the flow diagram of FIG. 1.

The torch 15 (FIG. 2) provides a high temperature ionized, conductive gas that is created within the torch. As shown in the above mentioned patents regarding "arc heaters", the torch comprises a pair of cylindrical electrodes 28, 29 that are longitudinally spaced by a gap 31, into which a pressurized gas, such as air, is injected to blow an electric arc 33 into the interior of the torch. The upstream and downstream ends of the arc are located on the electrodes 28, 29. An annular nozzle 35 is located between the electrode 29 and a burner chamber 37 that is contained within a cylindrical insulation 39 through which the plasma plume 41 extends. The nozzle 35 includes a plurality of peripherally spaced, radially extending inlets 43.

Primarily, the prior art procedure involves the use of a mixture of a solvent of MEK and methanol with the waste material (Askarel) which mixture is introduced into the torch 15 through the inlets 43 of the nozzle 35. This prior art procedure processes about 0.1 gallons of PCB per minute. It is noted that the solvent mixture of MEK and methanol is miscible with the PCB and air is used as torch gas to create plasma.

In accordance with this invention the solution is water, which is immiscible with non-polar type waste material, such as PCB and TCB. The water which is mixed with the waste material before introduction into the plasma torch. Pure oxygen (not air) is used as the torch gas. Water supplies hydrogen and oxygen that allows for an increased throughput of waste at a rate of up to twelve times that which is possible in the prior art system of FIG. 1. The waste material or feed is the Askarel fluid. An alternate method to preliminarily mixing the feed and water is to inject the feed and water separately through an air atomizing nozzle into the torch.

The use of the water instead of the MEK-methanol solvent is conducive to higher output of up to one gallon per minute when used in the torch 15 of the prior art FIG. 2.

As was set forth above water provide satisfactory results for the success of this invention. The amount of water mixed with waste is from about 30% to 200% by wt. The preferred amount of water is about 50% that of waste.

The system for pyrolytically decomposing waste material of this invention preferably involves the use of the flow diagram of FIG. 3. The apparatus includes a plasma torch 43, a recombination chamber 45, a combustion chamber 47, a scrubber 49, a draft fan 51, a stack 53, and a storage tank 55. The torch 43 (FIG. 4) provides a high temperature ionized, conductive gas which is created within the torch by the interaction of a gas with an electric or plasma arc 57 produced by the torch 43 in a manner similar to that set forth in the above-mentioned U.S. patents. The interaction within the torch 43 disassociates the gas into electrons and ions which cause the gas to become both thermally and electrically conductive. The conductive properties of the ionized gas in the arc region provides a means to transfer energy from the arc to the incoming process gas. This state is called a "plasma" and exists within the immediate confines of the arc in the torch and is superheated to an extremely high temperature having a typical range of from 5000° C. to 15,000° C.

The extremely high temperatures and the ultraviolet radiation associated with the ionized superheated gases provides sufficient bond breaking energy to destroy the hazardous and toxic wastes. This pyrolytic process is designed to destroy pumpable liquid/solid mixtures with the pyroplasma arc torch 43.

To expedite movement of the material through the system, the feed is injected through a plurality of air atomizing nozzles 59 (FIG. 4) into a manifold 61 where it is mixed with air before it encountered with the plasma plume 57 at temperatures in excess of 5000° C. The compounds in the feed are reformed into compounds which are more stable at reactor temperatures according to basic thermodynamic equilibrium principles. According to the preferred embodiment of this invention the water (without methanol) and feed are mixed homogeneously and introduced through a feed inlet 63 and air enters through an air inlet 65.

Alternatively, the air atomizing nozzle 59 (FIG. 4) receives the waste feed that is mixed with water and/or methanol (up to 25%) and conducted through a static mixer 67, after which it is combined with compressed air at 69. From the nozzle 59 the waste feed 63 is introduced into the manifold 61 which is secured to the recombination chamber 45 by a mounting flange 71. The manifold 61 is annular and is disposed between an outer housing 72 and a sleeve 73 which is comprised of refractory or silicon carbide coated graphite. Within the manifold 61 the waste feed 63 is mixed with the air 65 and is emitted through outlets 75 to form a flame zone 77 with the plasma 79 which zone is the result of partial combustion of waste feed mixtures. As described in the above-mentioned U.S. patents the plasma 79 results from the combination of the electric arc 57 and torch gas 81 introduced through a gap 83 between cylindrical electrodes 85, 87 of the plasma torch 43. The resulting products are projected into the recombination chamber 45.

These products can be controlled by choosing different torch gases, such as pure oxygen, by adding solvent to adjust the elements input to the system, or by choosing the reactor temperature to optimize, or minimize, the formation of certain compounds. In the combustion process, the chlorine will compete with oxygen to form HCL over $H_2O$. According to the thermo-equilibrium formula, some of the initial chlorine will become $Cl_2$, while the rest of the chlorine converts to HCl. With this relatively high concentration of chlorine and oxygen, coupled with the locally high carbon loading, the formations of chlorinated dioxins and furans are highly possible in a conventional incinerator. It is known that flyash and flue gases from municipal incinerators contain dioxins and furans.

The plasma system of this invention usually operates in a slightly reduced atmosphere and the resulting flue gases are mostly $H_2$, CO, $CO_2$, C, $N_2$, $H_2O$, and HCl. From a thermodynamic standpoint all of the chlorine forms HCl because of the high concentrations of $H_2$ and low concentrations of $O_2$. Therefore, there are no free or very low $Cl_2$, $O_2$, Cl, and OH radicals to form dioxins and furans.

From the torch 43 the product gases together with solid particulate, such as carbon, enter the recombination chamber 45 which is an air filter such as a cyclone separator. The product gases and solid particulate entering the recombination chamber 45 have temperatures ranging from 1000° to 1500° C. with a preferred temperature of 1200° C. In the chamber 45 the product gases exit through an outlet 89 and through a valve 91 to the combustion chamber 47. The dominant portion of the solid particulate 93 settles at the bottom of the chamber 45. There it accumulates until it is dumped.

For that purpose a high temperature dump valve 95 is provided in the bottom wall of the chamber 45 which valve comprises an elongated tube 97 in which a sliding stopper rod 99 is slidably mounted. A rod actuator 101 is provided for lowering the rod in order to open the tube 97 to enable the accumulated solid particulate 93 to drop through the tube and through a conduit 103 into a separator 105. The purpose of the separator is to remove any carry-over gases which are mixed with the particulate in the recombination chamber 45. For that purpose the separator 105 is a cyclone separator into which the solid particulate enters from the conduit 103 with sufficient centrifugal force to throw the solid particulate out against the wall and drop into the lower portion of the separator tank. The separated gas exits from the separator 105 through a filter 107 and through a conduit 109 and a valve 111 from where it is conducted to the combustion chamber 47. To cool the accumulated gas-free solid particulate 93 a heat exchanger having a coolant inlet 113 and a coolant outlet 115 is provided. Ultimately, the solid particulate 93 is discharged from the separator 105 through a discharge valve. The purpose of the filter 107 is to filter out any remaining solid particulate that may be carried by the gas as it exits from the separator 105.

During normal operation of the system with product gases from the torch entering the recombination chamber 45 under centrifugal force and with the particulate 93 accumulating in the lower portion of the chamber, the gases exit from the chamber through a filter 119 and into the outlet 89. Manifestly, the filter 119 like the filter 107 eliminates most of the particulate that may be carried by the gas into the outlet 89 and therefrom into the combustion chamber 47. During that operation the valve 91 is open and the valve 111 in the conduit 109 is closed. Inasmuch as the entire system is closed, the draft fan 51 sustains a partial vacuum through the several parts 45, 47, 49, and the interconnecting conduits therebetween. Accordingly, the gas moves from the recombination chamber 45 through the conduit 119 when valve 91 is opened.

Conversely, when the dump valve 95 is opened, valve 91 is closed and valve 111 is opened, whereby the gas leaving the separator 105 is carried through the conduit 109 to the combustion chamber 47 in response to the partial vacuum created by the draft fan 51.

The combustion chamber 47 has a primary function of burning the process gases ($H_2$, CO, $CO_2$, $N_2$, $H_2O$, HCl) which enter the chamber. For that purpose an air inlet 123 is provided to convert those gases to a gas mixture comprising $CO_2$, $H_2O$, $N_2$, and HCl. Thereafter the gas mixture moves through the scrubber 49.

A secondary function of the combustion chamber 47 is to act as a conduit for the product gases leaving the recombination chamber 45. The gas leaves the combustion chamber 47 through a conduit 125 into the scrubber 49 where it is subjected to a water spray having an inlet 127 in order to eliminate any solid particulate which lingers in the gas. The resulting blow-down water 129 containing particulate accumulates in the lower portion of the scrubber 49 from where it is periodically drained through an outlet 131.

In addition to the water entering through the inlet 127, a caustic solution is introduced into the water at 133 for the purpose of converting the HCl in the gas to a chloride compound. A preferred caustic solution is sodium hydroxide (NaOH) which reacts with the HCl in accordance with the following formula:

$$NaOH + HCl \rightarrow NaCl + H_2O.$$

The resulting compound (NaCl) is drained from the scrubber with the blow-down water 129. The resulting gas mixture includes $CO_2$, $H_2O$, and $N_2$ which move through a conduit 135 through the draft fan and through a conduit 137 to the stack 53 where it is dissipated into the atmosphere as a non-toxic gas and devoid of solid particulate.

In the alternative, where the combustion chamber 47 serves as a mere conduit for the product gases entering through the conduit 109, without being burned, the gases pass through the scrubber 49. Again the gases are subjected to the caustic solution to eliminate the HCl and exit from the scrubber via the conduit 135 as combustable fuel consisting of $H_2$, CO, $CO_2$, $N_2$, and $H_2O$. From the draft fan 51 the fuel is diverted by a valve 139 and through a conduit 141 to the storage tank 55 from which the fuel is withdrawn as required.

In order to conserve water the foregoing system includes a recycle means for reintroducing the water into the scrubber at 127. For that purpose some of the blow-down water is eliminated at outlet 143 with the remaining blow-down water moving through a liquid solid separator 143 and a heat exchanger 145. The liquid solid separator 143 functions to eliminate any lingering solid particulate. The heat exchanger 145 functions to adjust the water to the desired temperature. Manifestly, any caustic solution remaining in the blow-down water in the scrubber tank is recirculated to the scrubber tank for the purpose intended.

The system of this invention, as shown in FIG. 3 increases the feed throughput at least three gallons/minute and dramatically reduces the fuel gas volume over the system shown in FIG. 1. The system of this invention also removes the free carbon directly from the recombination chamber and flares the product gas in the combustion chamber. The high heating values of the production gases can bypass the combustion process for other usage by closing the combustion air inlet 123. The principle of the solid removal system is initially based on high temperature dump valve 95 which is opened at designated intervals. When the dump valve is closed, valve 91 is opened while valve 111 is closed. Conversely, when the dump valve 95 is opened, valve 91 is closed and valve 111 is opened. In this manner the free carbon (solid particulate) is sucked out of the recombination chamber 45 into the solid separator 105. The quenched free carbons then are removed by lock valve 117. The scrubber effluent is recycled back without the carbon overloading the problem existent in the system of FIG. 1.

Figure 4:
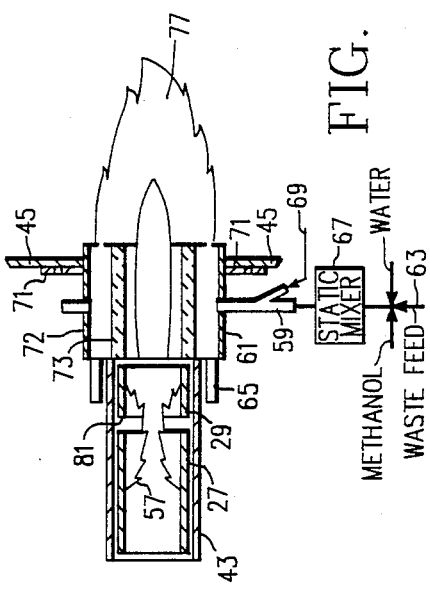
FIG. 4 is a sectional view through a pyroplasma unit of this invention.

The primary differences between the system of this invention (FIG. 4) and that of the prior art (FIG. 1) is that in accordance with this invention water or methanol is used to mix with the feed or waste material to supply hydrogen and oxygen couples with the modified new feed system as shown in FIG. 4 which enables the increase of the throughput of waste approximately 10 times faster than that of the prior art. Moreover, water and methanol is a cheaper solvent than the methyl ethyl ketone/methanol solvent used in the prior art system. Additionally, the method of this invention employs the use of an air atomization nozzle to spray the feed into the plasma stream which improves on the single feed ring of the prior art structure.

The feed system of prior art (FIG. 1) injects the waste feed solution directly into the plasma arc to produce a lot of undesirable carbon especially when processing the chlorinated aromatic compounds. The feed system of the system of FIG. 4 alleviates the carbon formation by mixing air or oxygen before it contacts with the plasma plume.

Further, the recombination chamber 45 of this method removes most of the solid before entering the combustion chamber. Because the recombination chamber separates most of the particulate, a higher feed throughout the plasma torch is possible compared to the prior art. At the same time larger particles of particulate can be fed because it is readily eliminated through the solid separator.

Furthermore, the combustion chamber may be used as a conduit for the product gases from the recombustion chamber without burning the gases so that the gases may be used as a fuel instead of being flared and discarded through the stack.

Additionally, a water consumption can be reduced by recycling the blowdown water from the scrubber.

Finally, alternate torch gases, such as oxygen, may be employed instead of air to increase the throughput and to reduce the formation of cyanide (HCN) which results from nitrogen in the air. Thus, the problem of the formation of cyanide in the prior art system is virtually eliminated.

What is claimed is:

1. A method for pyrolytically decomposing waste material, including the steps of:
   (a) producing a plasma by use of oxygen as the torch gas;
   (b) atomizing waste material and a source of hydrogen and oxygen, then injecting the atomized waste material and source of hydrogen and oxygen into the plasma, having a temperature in excess of 5000° C., to form a mixture of product gases and solid particulate;
   (c) separating the gases and particulate mixture in a recombination chamber into separate phases of gases and solid particulate;
   (d) transferring the solid particulate to separate compartment and subjecting the particulate to a partial vacuum to separate any carryover gases from the particulate which carryover gases are combined with the gases from the recombination chamber;
   (e) transferring the gas from the recombination chamber to a scrubber and subjecting the gas to a water spray to eliminate any carryover solid particulate from the gases; and
   (f) removing the scrubbed gases from the scrubber.

2. The method of claim 1 wherein prior to step (b) the waste material and source of hydrogen and oxygen are mixed homogeneously.

3. The method of claim 1 in which the source of hydrogen and oxygen is a compound selected from the group consisting of water and methanol.

4. The method of claim 1 in which the source of hydrogen and oxygen is water.

5. The method of claim 4 in which the amount of water added to waste material is from about 30% to about 200% by weight.

6. The method of claim 5 in which the amount of water added to waste material is about 50%.

7. The method of claim 3 in which the amount of methanol added to waste material is about 25%.

8. The method of claim 2 wherein the gases formed in step (c) includes HCl, and wherein at step (e) a caustic solution is added in the water spray to neutralize the HCl.

9. The method of claim 8 wherein the gases formed in step (c) also comprise $H_2$, $H_2O$, $CO$, $CO_2$, $N_2$.

10. The method of claim 9 wherein between steps (d) and (e) the gas is transferred to a combustion chamber and burned to form a gaseous mixture of $CO_2$, $H_2O$, $N_2$, and HCl.

11. The method of claim 1 wherein after step (e) the scrubbed gas is vented to the atmosphere.

12. The method of claim 1 wherein between steps (d) and (e) the scrub water is recirculated through the scrubber.

13. The method of claim 1 wherein the waste material comprises a pumpable substance.

14. The method of claim 1 wherein:
   the atomizing of step (b) is performed by forcing pressurized air into a mixture of liquid waste material and water.

15. Apparatus for pyrolytically decomposing waste material, comprising:
   (a) a plasma torch productive of a plasma having an operating temperature of at least 5000° C. for destroying a solution of a waste material to form a mixture of gases and solid particulate, said touch being combined with means for introducing the waste material in an atomized state;
   (b) a recombination chamber for receiving and separating the mixture of gases and solid particulate;
   (c) a solid separator for providing a partial vacuum for removing any carryover gases from the solid particulate;
   (d) a transfer chamber for receiving gases from the recombination chamber;
   (e) a scrubber for cleaning the gas from the chamber by passing the gas through a water spray; and
   (f) storage means for gases from the scrubber.

16. The apparatus of claim 15 in which the transfer chamber is a combustion chamber.

17. The apparatus of claim 16 in which the recombination chamber, solid separator, transfer chamber, and scrubber are interconnected to draft means.

18. The apparatus of claim 15 wherein:
   said means for introducing the waste material in an atomized state includes means for forcing pressurized air into a mixture of the waste material and water.

* * * * *